United States Patent
Marathe et al.

(10) Patent No.: US 7,146,588 B1
(45) Date of Patent: Dec. 5, 2006

(54) PREDICTING EM RELIABILITY BY DECOUPLING EXTRINSIC AND INTRINSIC SIGMA

(75) Inventors: Amit P. Marathe, Sunnyvale, CA (US); Darrell Erb, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 206 days.

(21) Appl. No.: 10/909,438

(22) Filed: Aug. 2, 2004

(51) Int. Cl.
*G06F 17/50* (2006.01)
*G01R 27/28* (2006.01)

(52) U.S. Cl. .......................................... 716/4; 702/117
(58) Field of Classification Search .................... 714/4; 324/525, 527, 537; 382/145; 700/121; 702/117; 716/4
See application file for complete search history.

(56) References Cited

U.S. PATENT DOCUMENTS

| | | | |
|---|---|---|---|
| 5,533,197 A * | 7/1996 | Moran et al. ................... 714/55 |
| 5,822,218 A * | 10/1998 | Moosa et al. .................... 716/4 |
| 6,136,619 A * | 10/2000 | Ceuninck et al. .............. 438/18 |
| 6,350,626 B1 * | 2/2002 | Cheng et al. ................... 438/14 |
| 6,578,178 B1 * | 6/2003 | Mau ................................ 716/2 |
| 6,603,321 B1 * | 8/2003 | Filippi et al. ................. 324/719 |
| 6,879,925 B1 * | 4/2005 | Sasagawa ..................... 702/123 |
| 2003/0066036 A1 * | 4/2003 | Mau ................................ 716/2 |
| 2003/0080761 A1 * | 5/2003 | Filippi et al. ................. 324/719 |
| 2003/0097228 A1 * | 5/2003 | Satya et al. .................... 702/82 |
| 2004/0036495 A1 * | 2/2004 | Fazekas et al. .............. 324/765 |
| 2005/0274989 A1 * | 12/2005 | Fischer et al. ............... 257/232 |

\* cited by examiner

*Primary Examiner*—Stacy A Whitmore
(74) *Attorney, Agent, or Firm*—Amin & Turocy, LLP

(57) ABSTRACT

Systems and methods are disclosed that facilitate predicting electromigration (EM) reliability in semiconductor wafers via decoupling intrinsic and extrinsic components of EM reliability. Electrical cross-sections of wafer test lines can be determined and individual currents can be forced through the test lines to force a constant current density across a test wafer. An EM reliability test can be performed to determine a purely intrinsic component of EM reliability. A single current can then be applied to all test lines and a second EM reliability test can be performed to determine total EM reliability. Standard deviations, or sigma, of failure distributions can be derived for each EM test. Intrinsic sigma can be subtracted from total sigma to yield an extrinsic sigma associated with process variation in wafer fabrication. Sigmas can then be utilized to predict EM reliability when process variations are adjusted, without application of a damaging package-level EM test.

23 Claims, 13 Drawing Sheets

PREDICTING EM RELIABILITY BY DECOUPLING EXTRINSIC AND INTRINSIC SIGMA

TECHNICAL FIELD

The present invention relates generally to semiconductor fabrication, and more particularly to systems and methodologies to facilitate predicting electromigration reliability in wafer manufacture.

BACKGROUND OF THE INVENTION

In the semiconductor industry, there is a continuing trend toward higher device densities. To achieve these high device densities there have been, and continue to be, efforts toward scaling down device dimensions (e.g., at sub-micron levels) on semiconductor wafers. In order to accomplish such densities, smaller feature sizes and more precise feature shapes are required. This may include width and spacing of interconnecting lines, spacing and diameter of contact holes, and surface geometry, such as corners and edges, of various features. The dimensions of and between such small features can be referred to as critical dimensions (CDs). Reducing CDs and reproducing more accurate CDs facilitates achieving higher device densities.

Today's standard packaging densities can tolerate over a kilometer of metallic interconnects in a single chip, which can result in delays that can be substantial when considering the speeds at which modern integrated circuits perform activities. For example, delays can be a result of parasitic capacitance, which can increase as CD decreases between pattern lines on a wafer. Additionally, electromigration can cause a significant number of problems in conventional integrated chips, such as, for example, open circuits caused by voids of metal atoms, and short-circuits between lines caused by an overabundance of metal atoms that he migrated to an undesirable region.

Such wafer defects have prompted wafer fabrication facilities to initiate wide-spread process controls in an attempt to mitigate wafer defects and increase wafer throughput. Currently, wafer fabrication facilities monitor thousands of wafer parameters in order to achieve the above-mentioned goals. Accordingly, control protocols, such as wafer level reliability (WLR) testing, continue to gain popularity as process controls for identifying potential factors that can detrimentally affect device reliability. However, there remains an unmet need in the art for systems and methods that improve efficiency and speed in wafer fabrication while reducing production costs.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides for systems and methods that facilitate electromigration (EM) reliability prediction(s) in wafer fabrication via analyzing and/or adjusting extrinsic and intrinsic components of wafer fabrication processes. Conventional EM reliability tests for technology qualification include intrinsic and extrinsic components, which are typically inseparably married so that decoupling of the components is difficult.

According to an aspect of the present invention, extrinsic and intrinsic components of an EM reliability test can be decoupled in order to facilitate isolating the effect(s) of process-related defects and quantify the impact of such defects on EM reliability. Such information can be utilized as an input to wafer fabrication facilities for process control. Such process control can be employed to reduce the extrinsic component of reliability. Furthermore, conventional wafer level reliability (WLR) testing tools can be employed to measure the extrinsic component of EM reliability, which can provide information that can be used in conjunction with the intrinsic component of EM reliability to predict overall reliability. Additionally, the systems and methods described herein can facilitate EM reliability prediction in order to mitigate the need to perform package-level EM tests, which are time-consuming and can result in the destruction of the test wafer(s).

According to an aspect of the invention, an electrical cross-section of metallic (e.g., copper, aluminum, etc.) test lines on a wafer can be determined using conventional temperature coefficient of resistivity (TCR) measurements. Such can be determined prior to performing an EM reliability test. Based on information gleaned from the cross-section of the metallic lines, test currents can be adjusted to force a constant current density for all samples being tested. This aspect of the invention facilitates mitigating extrinsic components of EM reliability failure distribution in order to determine a purely intrinsic component thereof. Once the intrinsic component has been determined, an EM reliability test can be performed without regard to cross-sectional area of test lines to determine a failure distribution comprising both intrinsic and extrinsic components of EM reliability. By disregarding cross-sectional areas of the test lines, a single test current will provide current densities that vary across the wafer. The difference between the sigmas of the two distributions is the extrinsic component, which is related to process variation in a wafer fabrication facility.

Yet another aspect of the invention provides for employing sigma information related to EM reliability in a wafer fabrication facility to control process variation, and thereby facilitate evaluation of the potential impact of, for example, decreasing the extrinsic component, on overall EM reliability. Since the intrinsic component of EM reliability remains constant and can be measured prior to a manufacturing phase, as described above, the present invention can take advantage of wafer level metrology systems in order to measure extrinsic process variation(s) during a manufacturing phase. Such measured extrinsic information can be utilized in conjunction with intrinsic sigma information to predict EM reliability of production wafers without requiring a time-consuming package-level EM test.

To the accomplishment of the foregoing and related ends, certain illustrative aspects of the invention are described herein in connection with the following description and the annexed drawings. These aspects are indicative, however, of but a few of the various ways in which the principles of the invention can be employed and the present invention is intended to include all such aspects and their equivalents. Other advantages and novel features of the invention will become apparent from the following detailed description of the invention when considered in conjunction with the drawings.

DETAILED DESCRIPTION OF THE INVENTION

Figure 1:
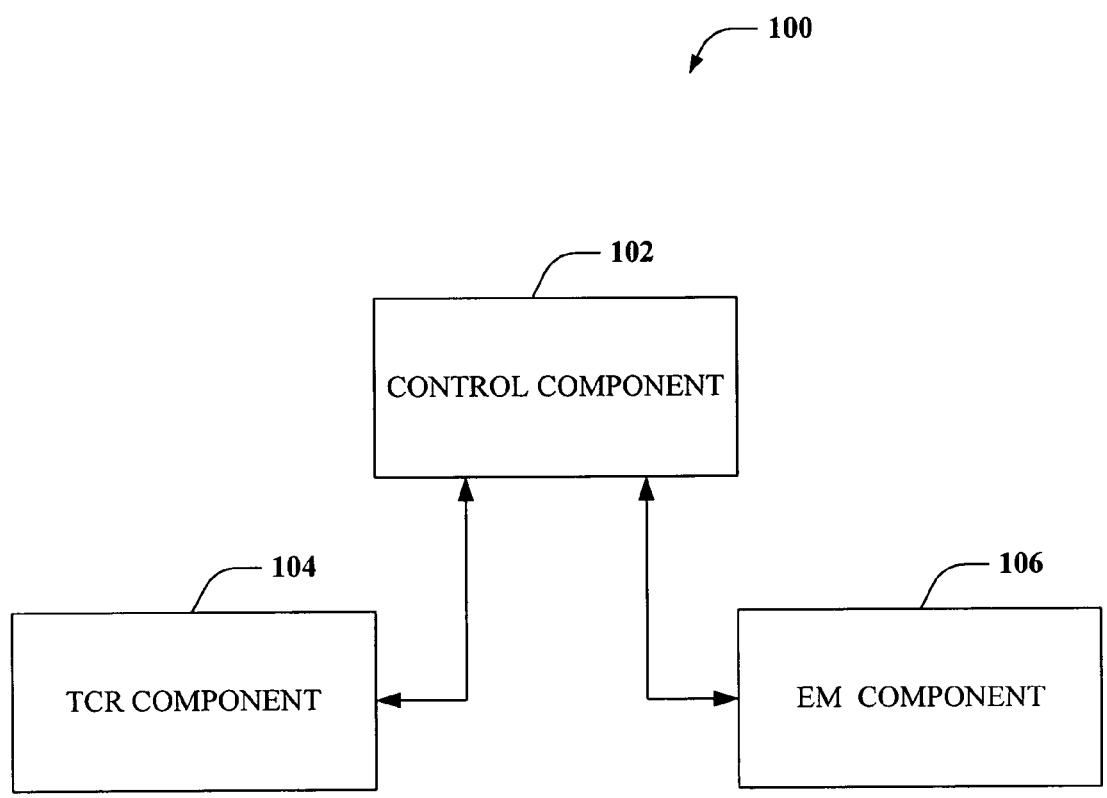
FIG. 1 is an illustration of a system 100 that facilitates predicting EM reliability of production wafers when process variation in a wafer fabrication facility is mitigated in accordance with an aspect of the present invention.

The present invention will now be described with reference to the drawings, wherein like reference numerals are used to refer to like elements throughout. The present invention will be described with reference to systems and methods for decoupling extrinsic and intrinsic components of electromigration reliability test results in order to facilitate predicting electromigration reliability of wafers in a wafer fabrication environment. It should be understood that the description of these exemplary aspects are merely illustrative and that they should not be taken in a limiting sense.

The term "component" refers to a computer-related entity, either hardware, a combination of hardware and software, software, or software in execution. For example, a component can be a process running on a processor, a processor, an object, an executable, a thread of execution, a program and a computer. By way of illustration, both an application running on a server and the server can be components. A component can reside in one physical location (e.g., in one computer) and/or can be distributed between two or more cooperating locations (e.g., parallel processing computer, computer network).

It is to be appreciated that various aspects of the present invention can employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks, and function link networks) can be employed.

Electromigration (EM) as used herein refers to the migration of metal atoms in a metal interconnect such as, for example, copper (Cu), which can occur as a result of momentum transfer from conduction electrons. Typically, metal atoms migrate in the same direction as current flow, which can cause failure in the metal line. EM can be correlated with temperature, where a higher melting point typically corresponds to a higher EM resistance. Therefore, metals with lower relative melting points are desirable, as is a lower current density. EM can be a result of diffusion through the bulk of the metal material itself, diffusion across grain boundaries, and/or diffusion at the surface of the metal. For example, aluminum (Al) exhibits EM primarily at grain boundaries because the grain boundary diffusivity of aluminum is greater than the bulk diffusivity, and the surface passivation effect of aluminum oxide, which forms on the aluminum surface when exposed to oxygen, is excellent. Conversely, copper has lower bulk and grain boundary EM and primarily exhibits EM on the surface due to relatively poor copper oxide passivation properties.

FIG. 1 is an illustration of an EM reliability prediction system 100 according to an aspect of the present invention, in which a control component 102 is operatively coupled to each of a temperature coefficient of resistivity (TCR) component 104 and an EM component 106. The control component 102 can receive information from the TCR component 104 in order to determine an electrical cross-section of, for example, copper lines on a wafer. The control component 102 can determine an appropriate current adjustment to ensure that a constant current density is forced across all test lines in a sample.

The electrical cross-section of copper interconnect lines and/or the electrical thickness of copper films can be calculated via, for example, measuring resistance of the interconnect(s) at a first temperature and then at a second temperature. For example, a mathematical representation of the relationship between temperature and resistance of an interconnect can be described by:

$$\Delta R/R_0 = \alpha \Delta T$$

where $R_0$ is interconnect resistance at a reference temperature (e.g., $T_0$), $\Delta R$ is the difference between a present resistance of the interconnect, R, and $R_0$ (e.g., $R-R_0$), $\Delta T$ is the difference between a present temperature of the interconnect and the reference temperature $T_0$ (e.g., $T-T_0$), and $\alpha$ is a temperature coefficient of resistance for the interconnect material. Thus, R can be determined by the TCR component 104 because $T_0$, $R_0$, and $\alpha$ are known quantities, and T can be measured by the TCR component. Once T has been measured, $\Delta T$ can be evaluated and multiplied by $\alpha$ and $R_0$. Finally, $R_0$ can be added to the resultant quantity to determine R, such that:

$$R=R_0[1+\alpha(T-T_0)]$$

It is to be appreciated that $\alpha$ can be evaluated as $d\rho/dT$, where $\rho$ is the resistivity of the interconnect material and T is temperature, such that change in resistivity with respect to temperature can be known to the TCR component 104. This value can be considered to be approximately constant over any temperature range in which resistance measurements can be made.

The control component 102 can receive information regarding the electrical cross-section of, for example, copper interconnect lines on a wafer, and determine an appropriate adjustment to test currents to be passed though particular interconnect lines, such that the adjusted currents will provide a constant current density, J, across all test subjects (e.g., in the range of 1.5 MA/cm$^2$, etc.). According to this scenario, a particular current passed through a given interconnect will depend on the cross-sectional area of the interconnect and the desired constant current density, such that multiplying current density by cross-sectional area produces the necessary current value. The EM component 106 can perform an EM reliability test while the constant current density is present across the test subjects, and that the results of the test can be employed to derive a purely intrinsic component of an EM failure distribution, since any extrinsic variation in electrical cross-section is effectively mitigated by forcing the constant current density.

Upon receiving information indicating that the EM reliability test is complete, the control component 102 can reset the test currents to a uniform value, such that current through all test lines is the same regardless of cross-section. In this manner, current densities will vary between lines of different cross-sectional area because it is inversely proportional to cross-sectional area and because the current has a constant value. For example, if a current, I, of 1.0 ampere is applied to two different lines having cross-sectional areas of $1.0\mu^2$ and $0.5\mu^2$, respectively, then respective current densities, J, will be 1 A/$\mu^2$ and 2 A/$\mu^2$ because J=I/C, where C is cross-sectional area. The values of the preceding scenario are exemplary in nature and are not intended to limit the scope of the present invention in any manner.

The control component 102 can then direct the EM component 106 to repeat the EM reliability test at the reset current level. The results of this second test will include, in addition to an intrinsic component, an extrinsic component that was absent from the first test and is due to current density variations between test lines. Since the intrinsic component of EM reliability remains constant regardless of the current applied during a given test, the extrinsic component can be evaluated by the control component 102 and/or the EM component 106. The extrinsic component of reliability can be evaluated via assessing the difference between value(s) associated with the second test (intrinsic-plus-extrinsic) and the value(s) associated with the first test (purely intrinsic). For example, a standard deviation, sigma, for the failure distribution of the intrinsic EM reliability test might be 0.31, and a sigma for a total EM reliability failure distribution from the second EM reliability test might be 0.6.

Thus extrinsic sigma will be 0.29. In this manner, the system 100 can effectively decouple an extrinsic reliability component from an intrinsic reliability component to determine the effects associated with extrinsic aspects of EM reliability, which can facilitate predicting EM reliability under a variety of circumstances.

Figure 2:
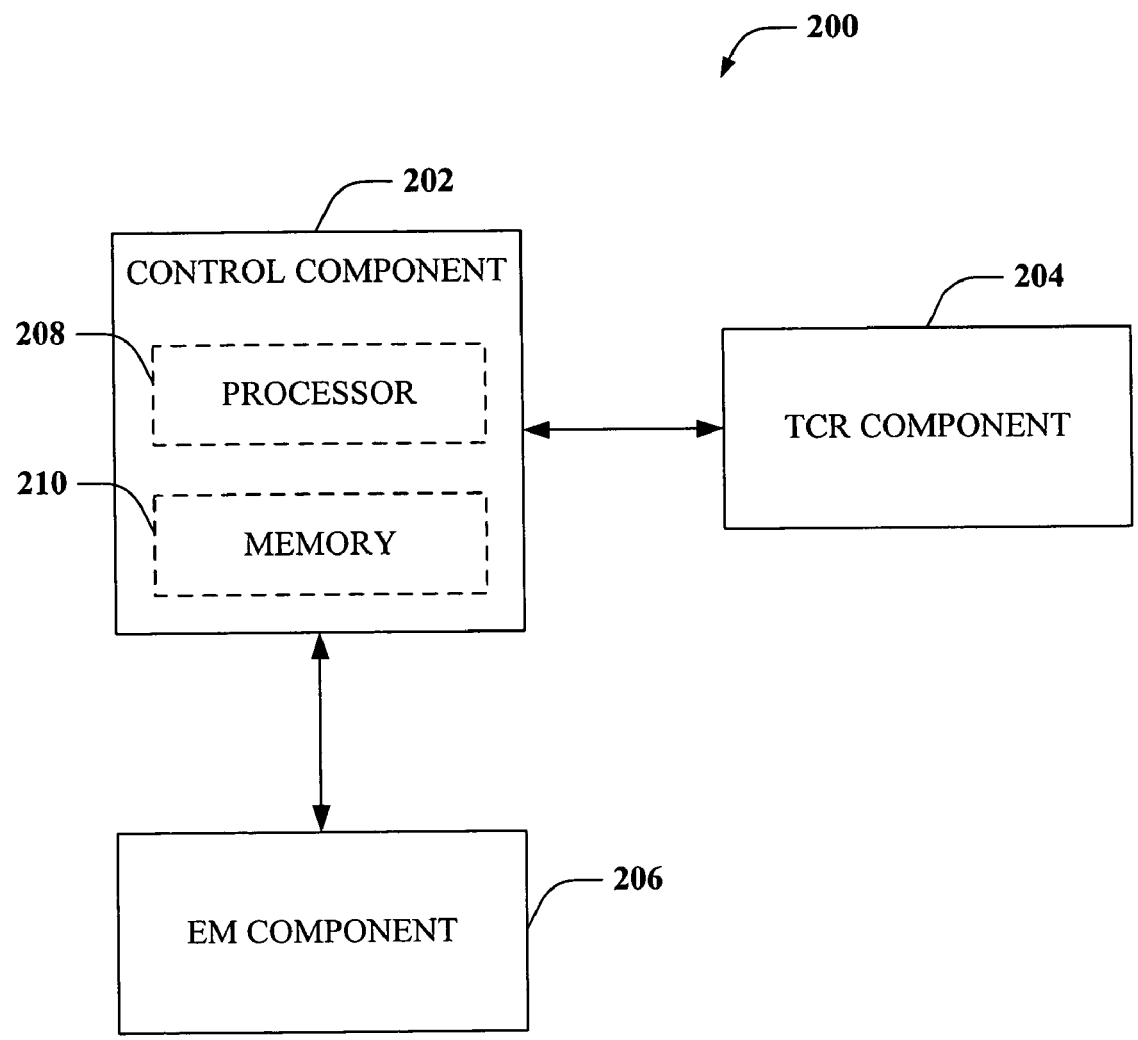
FIG. 2 is an illustration of a system 200 that facilitates predicting EM reliability of production wafers when process variation in a wafer fabrication facility is mitigated in accordance with an aspect of the present invention.

FIG. 2 illustrates an EM reliability prediction system 200 in accordance with an aspect of the present invention. A control component 202 is operatively coupled to a TCR component 204 and an EM component 206. The TCR component 204 determines a resistance of interconnects in a wafer (e.g., copper, aluminum, etc.) based on algorithm(s) that can account for temperature variation in the interconnects. Such information can be received by the control component 202 for analysis, and can be employed by the control component 202 to facilitate adjusting currents to be passed through interconnect test lines in order to achieve a constant current density for all test lines in an EM reliability test sample group. The system 200 can determine values and effects associated with an extrinsic component of EM reliability in order to facilitate predicting EM reliability under circumstances wherein the extrinsic aspects thereof are altered.

Additionally, the control component 202 comprises a processor 208 and a memory 210. It is to be understood that a that the processor 208 can be a processor dedicated to predicting EM reliability and/or to facilitate current adjustments, etc., a processor used to control one or more of the components of the EM reliability prediction system 200, or, alternatively, a processor that is both used to predict EM reliability and/or to facilitate current adjustments, etc., and to control one or more of the components of the EM reliability prediction system 200.

The memory component 210 can be employed to retain information associated with, for example, TCR measurement(s) of test lines, predicted EM reliability of a wafer, current adjustment for testing interconnects, etc. Furthermore, the memory 210 can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 210 of the present systems and methods is intended to comprise, without being limited to, these and any other suitable types of memory.

Figure 3:
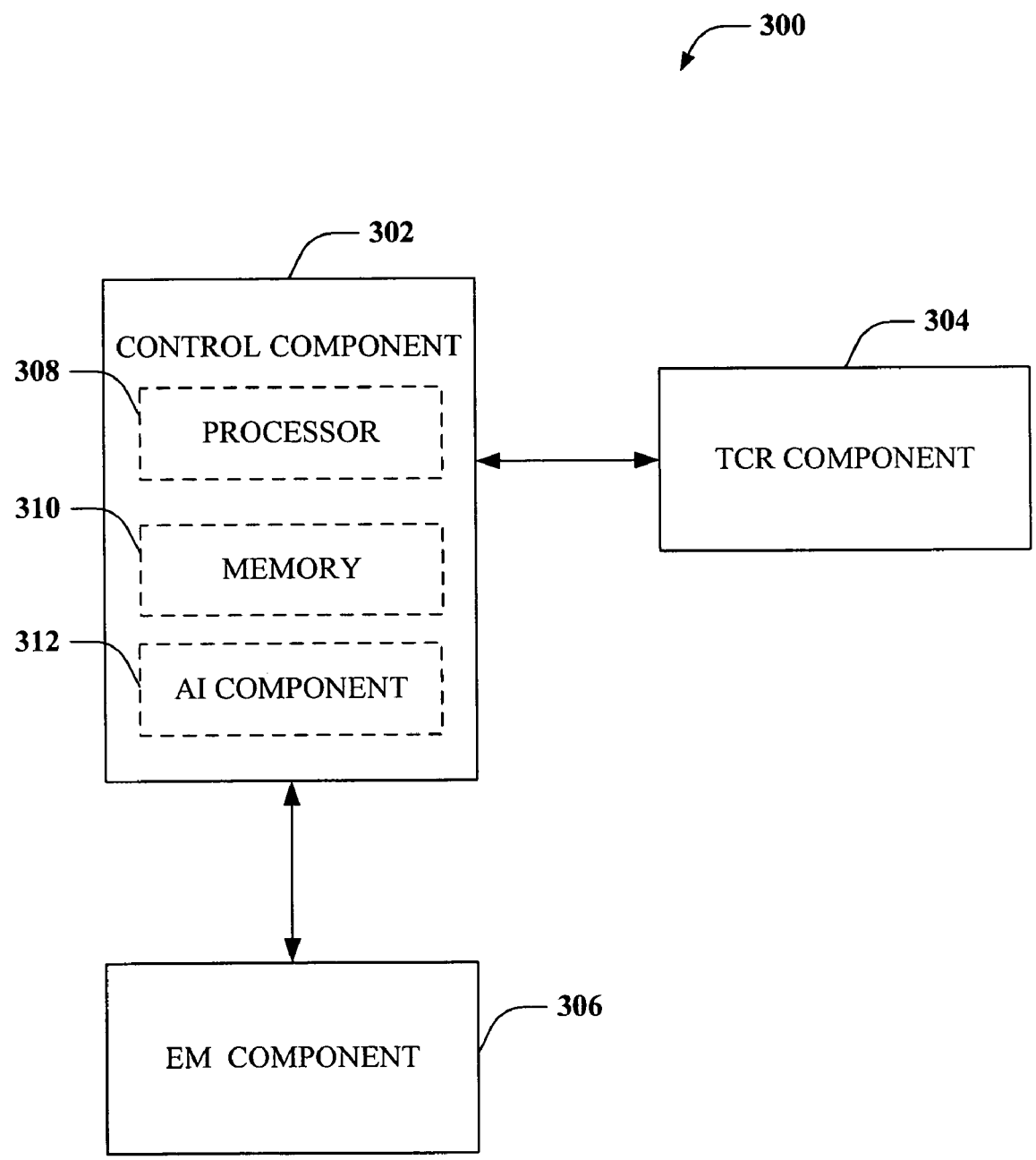
FIG. 3 is an illustration of a system 300 that facilitates predicting EM reliability of production wafers when process variation in a wafer fabrication facility is mitigated, comprising an artificial intelligence component in accordance with an aspect of the present invention.

FIG. 3 is an illustration of an EM reliability prediction system 300 in accordance with an aspect of the present invention. The system 300 can employ various inference schemes and/or techniques in connection with predicting EM reliability. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

Still referring to FIG. 3, a control component 302 is operatively connected to each of a TCR component 304 and an EM component 306. The TCR component can glean information from a test set of interconnect lines (e.g., copper, aluminum, etc.) in order to provide the control component 302 with data for determining electrical cross-sections(s) associated with interconnect line(s) to facilitate appropriate current adjustments to force a constant current density across test lines. The control component 302 comprises a processor 308, a memory 310, and an AI component 312. The AI component 312 can make inferences regarding, for example, a proper adjustment to current level(s) to facilitate achievement of a desired constant current density across a test wafer.

Upon achieving the desired current density, the control component 302 can direct the EM component 306 to perform an EM reliability test to determine a purely intrinsic component of EM reliability, which can be achieved because any extrinsic component(s) that might otherwise alter the reliability results is effectively mitigated by the application of the forced current density. The AI component 312 can then make further inferences regarding resetting the current level(s) to a standard setting to permit extrinsic variation of reliability. Based on such inferences, the control component 302 can again direct the EM component 306 to perform a reliability test under the new current conditions to facilitate a determination of reliability comprising both intrinsic and extrinsic components. Reliability issues related solely to the extrinsic component of EM reliability can be assessed by the control component 302 in order to facilitate predictions of how overall EM reliability will be affected to alterations to the extrinsic component.

Figure 4:
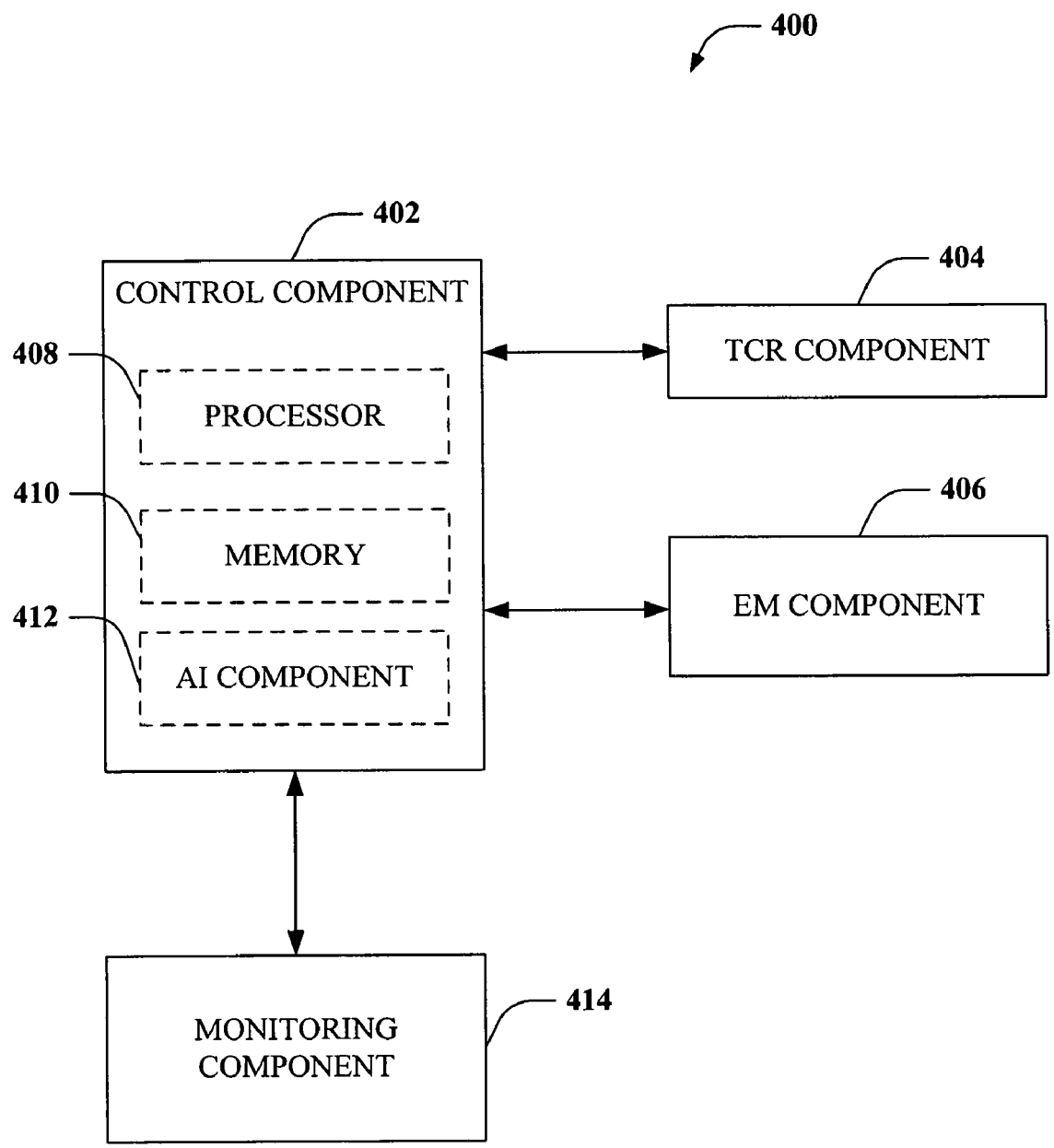
FIG. 4 is an illustration of a system 400 that facilitates predicting EM reliability of production wafers when process variation in a wafer fabrication facility is mitigated, comprising a monitoring component in accordance with an aspect of the present invention.

FIG. 4 is an illustration of an EM reliability prediction system in accordance with yet another aspect of the invention, comprising a control component 402 operatively coupled to a TCR component 404 and an EM component 406. The control component 402 comprises a processor 408 that can analyze information received from components with which the control component 402 is operatively associated. Additionally, the control component 402 comprises a memory component 410 that can store information associated with any of the functionalities of the EM reliability prediction system 400, and an AI component 412 that can make inferences to increase efficiency of the EM reliability prediction system 400.

As illustrated in FIG. 4, a monitoring component 414 is operatively coupled to the control component 402. The monitoring component can be for example, any suitable wafer level metrology system that can monitor various parameters of test wafers in order to further facilitate decoupling of extrinsic and intrinsic EM reliability components. Additionally, the monitoring component 414 can be employed in situ in a wafer fabrication facility to measure extrinsic process variation(s). Such measurements can be received by the control component 402 and analyzed in conjunction with intrinsic reliability information (e.g., gathered prior to a manufacturing phase, etc.) to predict EM reliability of production wafers while mitigating the need for a package-level EM test, which is time-consuming and can destroy the test wafer(s).

It is to be appreciated that the monitoring component 414 can be, for example, a scatterometry component. The present invention contemplates any suitable scatterometry component and/or system, and such systems are intended to fall within the scope of the hereto-appended claims. It is further to be appreciated that the monitoring component 414 utilized by the present invention can be, for example, a Scanning Electron Microscope (SEM), a Critical Dimension Scanning Electron Microscope (CD-SEM), a Field Effect Scanning Electron Microscope (FESEM), an In-Lens FESEM, or a Semi-In-Lens FESEM, depending on the desired magnification and precision. For example, FESEM permits greater levels of magnification and resolution at high or low energy levels by rastering a narrower electron beam over the sample area. FESEM thus permits quality resolution at approximately 1.5 nm. Because FESEM can produce high-quality images at a wide range of accelerating voltages (typically 0.5 kV to 30 kV), it is able to do so without inducing extensive electrical charge in the sample. Furthermore, conventional SEM cannot accurately image an insulating material unless the material is first coated with an electrically conductive material. FESEM mitigates the need to deposit an electrically conductive coating prior to scanning. According to another example, the monitoring component 414 of the present invention can be In-Lens FESEM, which is capable of 0.5 nm resolution at an accelerating voltage of 30 kV, or any other suitable type of scanner, such as Transmission Electron Microscopy (TEM), Atomic Force Microscopy (AFM), Scanning Probe Microscopy (SPM), etc.

It is further to be appreciated that information gathered by the monitoring component 414 can be utilized for generating feedback and/or feed-forward data that can facilitate EM reliability predictions. The EM reliability prediction system 400 can additionally employ such data to control components and/or operating parameters associated therewith. For instance, feedback/feed-forward information can be generated from sequence analysis to control process variation and/or evaluate the potential impact of a reduced extrinsic component on overall EM reliability. Additionally, one or a plurality of sensors can be associated with the EM reliability prediction system 400 to permit data to be gathered regarding the state of the wafer (e.g., temperature, density, viscosity, material composition, and/or any other suitable information related to the condition of the wafer).

Figure 5:
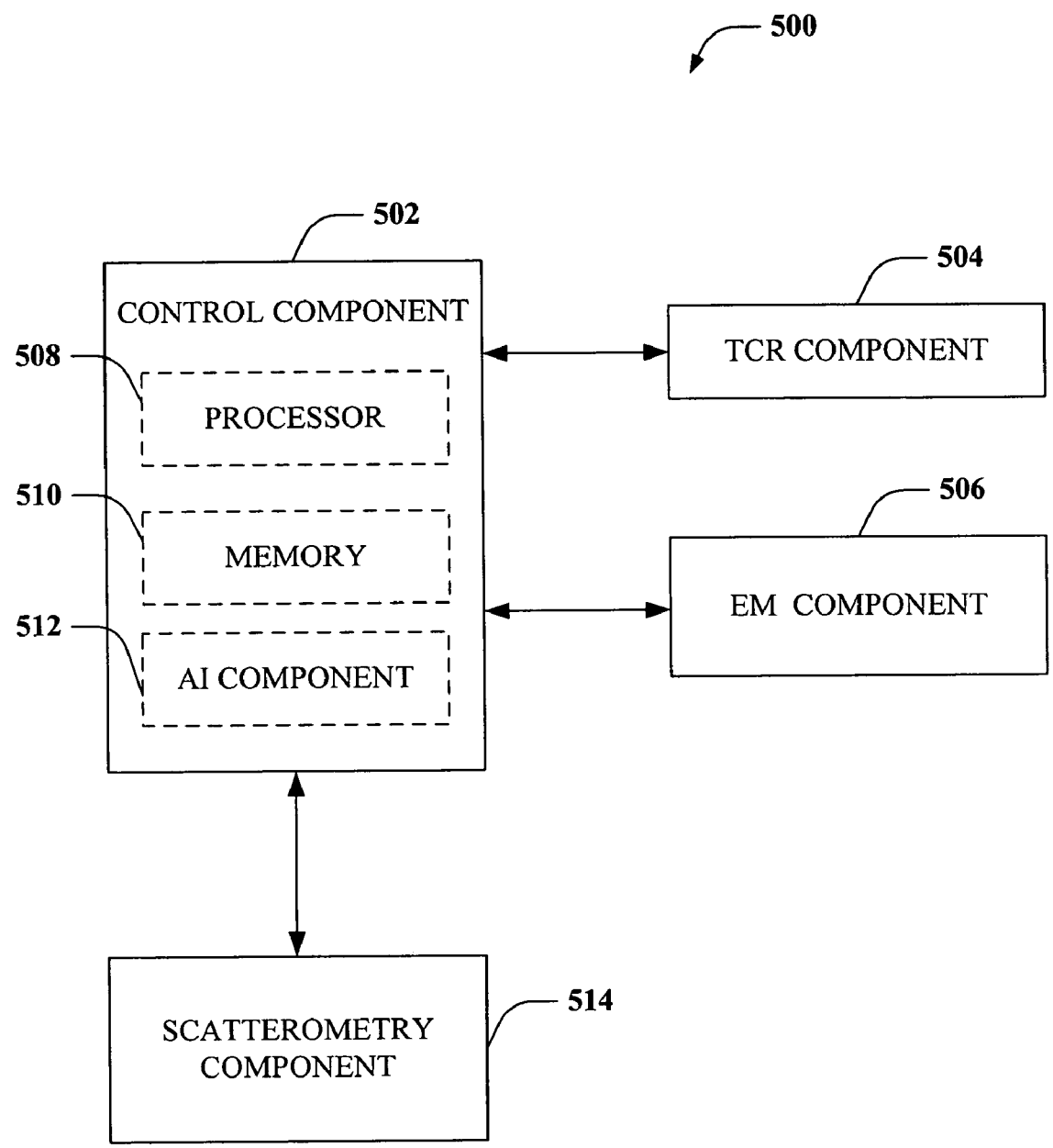
FIG. 5 is an illustration of a system 400 that facilitates predicting EM reliability of production wafers when process variation in a wafer fabrication facility is mitigated, comprising a scatterometry system in accordance with an aspect of the present invention.

FIG. 5 is an illustration of an EM reliability prediction system 500 in accordance with an aspect of the present invention. According to the figure, a control component 502 is operatively coupled to a TRC component 504, and an EM component 506. The control component 502 comprises a processor 508 that can analyze information received from components with which the control component 502 is operatively associated. Additionally, the control component 502 comprises a memory component 510 that can store information associated with any of the functionalities of the EM reliability prediction system 500, and an AI component 512 that can make inferences to increase efficiency of the EM reliability prediction system 500. As illustrated in FIG. 5, a monitoring component 514 is operatively coupled to the control component 502. The scatterometry component 514 is particularly well-adapted to monitor a wafer in conjunction with aspects of the present invention.

Scatterometry is a technique for extracting information about a surface upon which incident light has been directed. Information concerning properties including, but not limited to, dishing, erosion, profile, chemical composition, thickness of thin films and critical dimensions of features present on a surface such as a wafer can be extracted. Furthermore, information about an immersion medium such as refractive index and lithographic constant can be extracted by utilizing scatterometry techniques. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the chemical properties of the surface, the planarity of the surface, features on the surface, voids in the surface, and the number, type of layers beneath the surface, refractive index of the surface, etc.

Different combinations of the above-mentioned properties will have different effects on the phase and/or intensity of the incident light resulting in substantially unique intensity/phase signatures in the complex reflected and/or diffracted light. Thus, by examining a signal (signature) library of intensity/phase signatures, a determination can be made concerning the properties of the immersion medium utilized in connection with a known grating structure on the surface. Such substantially unique phase/intensity signatures are produced by light reflected from and/or refracted by different surfaces and/or immersion mediums due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N = n - jk$$

where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer or of an immersion medium can generate a second phase/intensity signature. For example, a line of a first width may generate a first signature while a line of a second width may generate a second signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received from scatterometry detecting components, the phase/intensity signals can be pattern matched, for example, to the library of signals, to determine whether the signals correspond to a stored signature. The present invention contemplates any suitable scatterometry component and/or system, and such systems are intended to fall within the scope of the hereto-appended claims.

Figures 6, 7, 8:
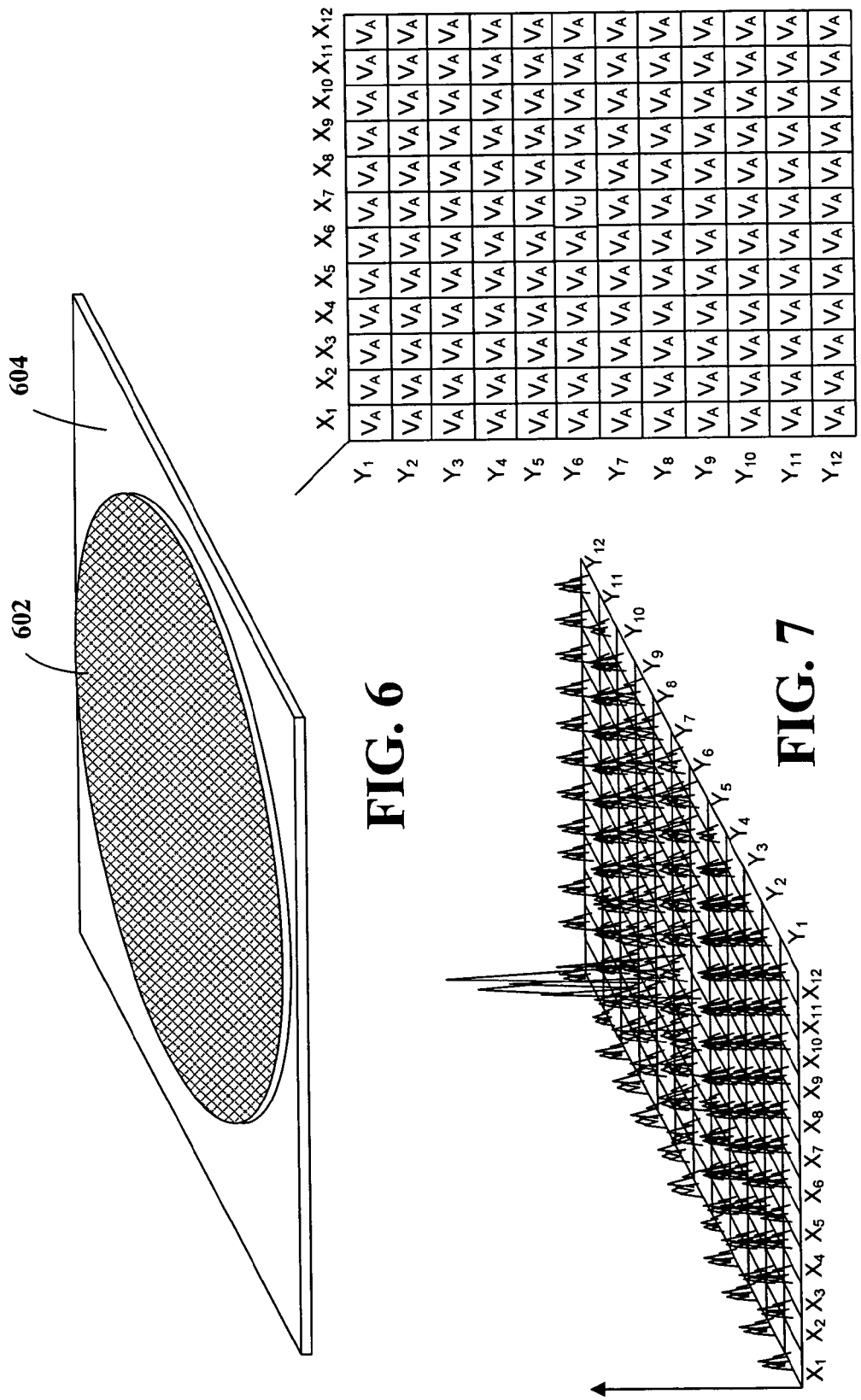
FIG. 6 illustrates a perspective view of a grid-mapped mask according to one or more aspects of the present invention.
FIG. 7 illustrates plots of measurements taken at grid-mapped locations on a mask in accordance with one or more aspects of the present invention.
FIG. 8 illustrates a table containing entries corresponding to measurements taken at respective grid-mapped locations on a mask in accordance with one or more aspects of the present invention.

FIG. 6 illustrates a perspective view of the steppable stage 604 supporting a wafer 602. The wafer 602 can be divided into a grid pattern as shown in FIG. 7. Each grid block (XY) of the grid pattern corresponds to a particular portion of the wafer 602 (e.g., a die or a portion of a die). The grid blocks are individually monitored for fabrication progress by concurrently measuring critical dimensions and overlay with either scatterometry or scanning electron microscope (SEM) techniques.

This can also be applicable in order to assess wafer-to-wafer and lot-to-lot variations. For example, a portion P (not shown) of a first wafer (not shown) can be compared to the corresponding portion P (not shown) of a second wafer. Thus, deviations between wafers and lots can be determined in order to calculate adjustments to the fabrication components that are necessary to accommodate for the wafer-to-wafer and/or lot-to-lot variations.

In FIG. 7, one or more respective portions of the wafer 602 ($X_1Y_1 \ldots X_{12}, Y_{12}$) are concurrently monitored for critical dimensions and overlay utilizing either scatterometry or scanning electron microscope techniques. Exemplary measurements produced during fabrication for each grid block are illustrated as respective plots. The plots can, for example, be composite valuations of signatures of critical dimensions and overlay. Alternatively, critical dimensions and overlay values can be compared separately to their respective tolerance limits.

As can be seen, the measurement at coordinate $X_7Y_6$ yields a plot that is substantially higher than the measurement of the other portions XY. This can be indicative of overlay, overlay error, and/or one or more critical dimension(s) outside of acceptable tolerances. As such, fabrication components and/or operating parameters associated therewith can be adjusted accordingly to mitigate repetition of this aberrational measurement. It is to be appreciated that the wafer 602 and or one or more die located thereon can be mapped into any suitable number and/or arrangement of grid blocks to effect desired monitoring and control.

FIG. 8 is a representative table of concurrently measured critical dimensions and overlay taken at various portions of the wafer 602 mapped to respective grid blocks. The measurements in the table can, for example, be amalgams of respective critical dimension and overlay signatures. As can be seen, all the grid blocks, except grid block $X_7Y_6$, have measurement values corresponding to an acceptable value ($V_A$) (e.g., no overlay error is indicated and/or overlay measurements and critical dimensions are within acceptable tolerances), while grid block $X_7Y_6$ has an undesired value ($V_U$) (e.g., overlay and critical dimensions are not within acceptable tolerances, thus at least an overlay or CD error exists). Thus, it has been determined that an undesirable fabrication condition exists at the portion of the wafer 602 mapped by grid block $X_7Y_6$. Accordingly, fabrication process components and parameters can be adjusted as described herein to adapt the fabrication process accordingly to mitigate the re-occurrence or exaggeration of this unacceptable condition.

Alternatively, a sufficient number of grid blocks can have desirable thickness measurements so that the single offensive grid block does not warrant scrapping the entire wafer. It is to be appreciated that fabrication process parameters can be adapted so as to maintain, increase, decrease and/or qualitatively change the fabrication of the respective portions of the wafer 602 as desired. For example, when the fabrication process has reached a pre-determined threshold level (e.g., X % of grid blocks have acceptable CDs and no overlay error exists), a fabrication step can be terminated.

Figure 9:
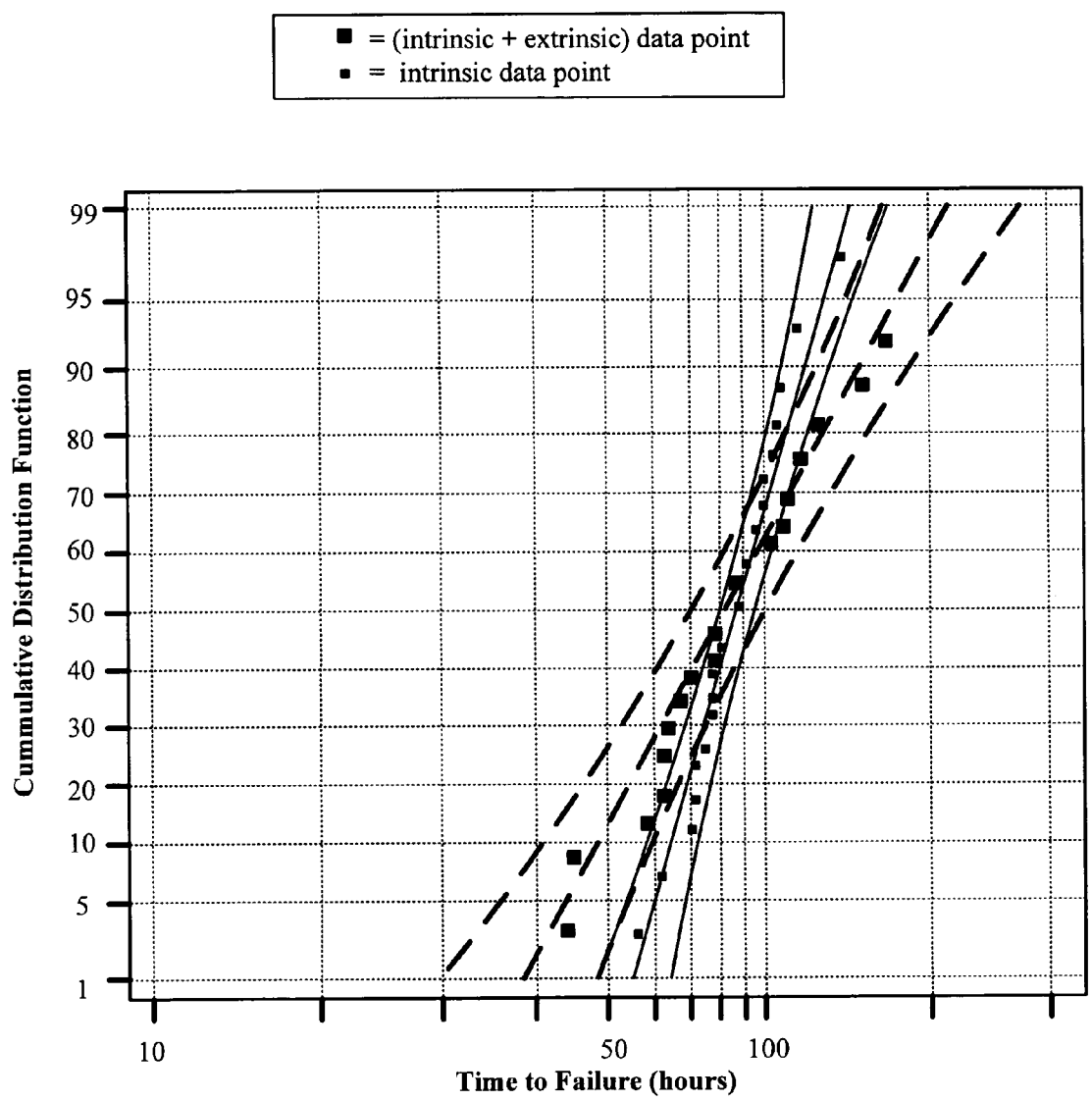
FIG. 9 is an illustration of a failure distribution comprising intrinsic and extrinsic components of EM reliability of an exemplary test wafer, and associated standard deviations.

FIG. 9 illustrates a failure distribution curve that exemplifies extrinsic and intrinsic sigmas. Purely intrinsic data points (e.g., from a first EM reliability test utilizing a forced constant current density, etc.) are shown as small squares, and total EM reliability data points (e.g., from a second EM reliability test employing a constant current through all test lines regardless of individual cross-section area, etc.) are shown as large squares. A best-fit solid line is illustrated with solid asymptotes to show the distribution of the intrinsic component of EM reliability. Similarly, a heavier, dashed best-fit line and associated asymptotes is illustrated to show total EM reliability failure distribution. This illustration exemplifies a fundamental aspect of the present invention in that total EM reliability can be improved as effects of the extrinsic component of EM reliability are reduced (e.g., mean time to failure is increased when extrinsic sigma is mitigated, etc.).

Turning briefly to FIGS. 10, 11, 12, and 13, methodologies that can be implemented in accordance with the present invention are illustrated. While, for purposes of simplicity of explanation, the methodologies are shown and described as a series of blocks, it is to be understood and appreciated that the present invention is not limited by the order of the blocks, as some blocks can, in accordance with the present invention, occur in different orders and/or concurrently with other blocks from that shown and described herein. Moreover, not all illustrated blocks may be required to implement the methodologies in accordance with the present invention.

Figure 10:
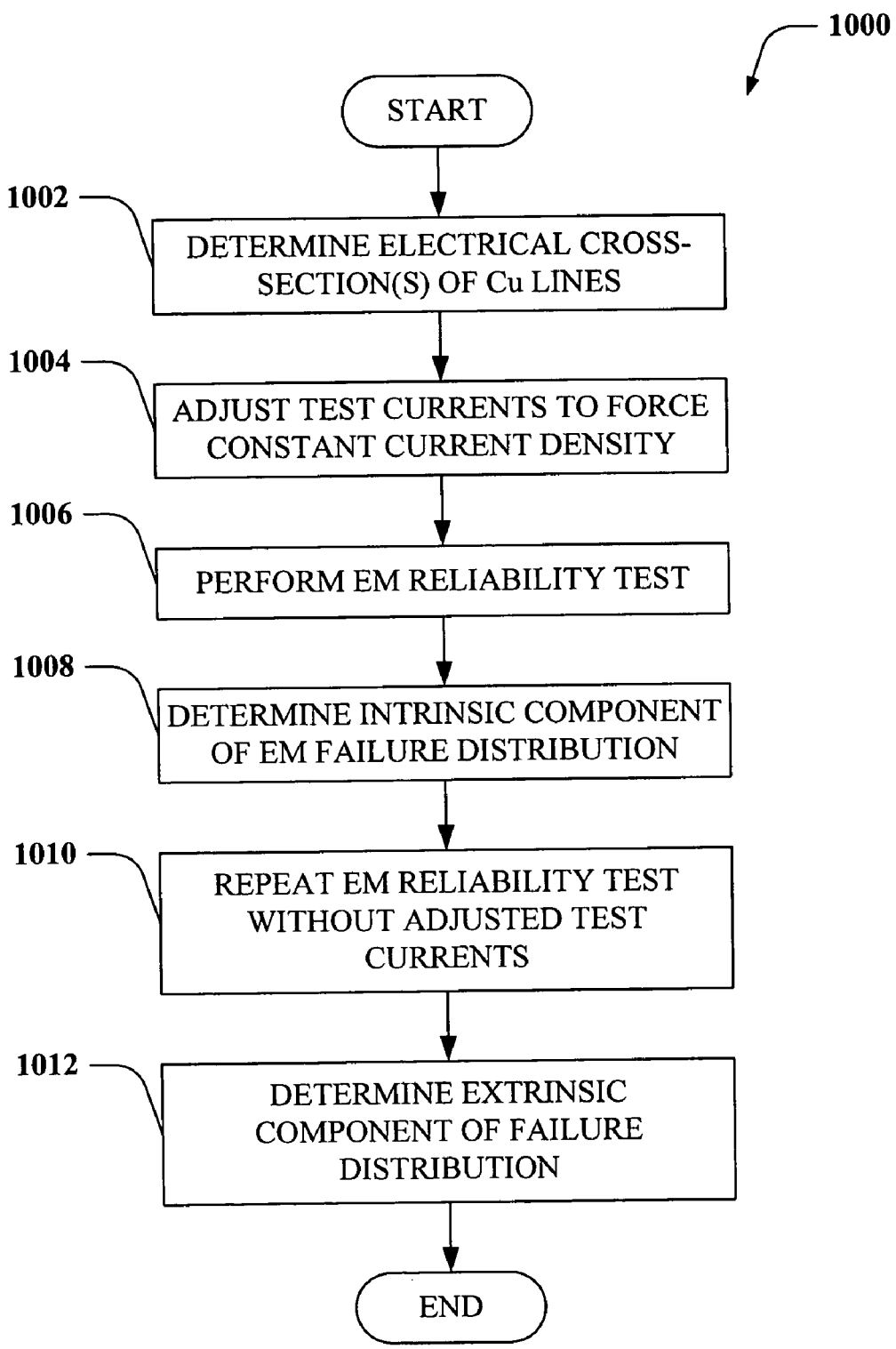
FIG. 10 is an illustration of a methodology 1000 for predicting EM reliability via decoupling intrinsic and extrinsic components thereof in accordance with an aspect of the present invention.

FIG. 10 is an illustration of a methodology 1000 in accordance with an aspect of the present invention. At 1002, an electrical cross-section of copper (Cu) test lines on a test wafer is determined. The cross-section can be determined by, for example, a temperature coefficient of resistance (TCR) component. At 1004, test current(s) can be adjusted to ensure that a constant current density is achieved throughout the wafer. An EM reliability test can be performed at 1006. Then, at 1008, a purely intrinsic component of EM reliability can be determined from the EM reliability test results. This is so because any extrinsic component of EM reliability has been effectively mitigated by the presence of the constant current density across the copper test lines. The intrinsic component can be expressed as a sigma value for a failure distribution derived from test data. At 1010, the EM reliability test can be repeated using normal test currents (e.g., a constant current for all test lines, etc.), which facilitates determining a complete failure distribution for the test lines.

At 1012, an extrinsic component of EM reliability can be determined, which is indicative of process variation in a wafer fabrication facility. The extrinsic component can be determined via evaluating sigma for the total failure distribution and subtracting the intrinsic sigma there from. In other words, extrinsic sigma is equal to the difference between total sigma and intrinsic sigma. Decoupling the extrinsic component from the intrinsic component of EM reliability can facilitate making predictions based on EM reliability variation due to, for example, manipulation of the extrinsic component.

Figure 11:
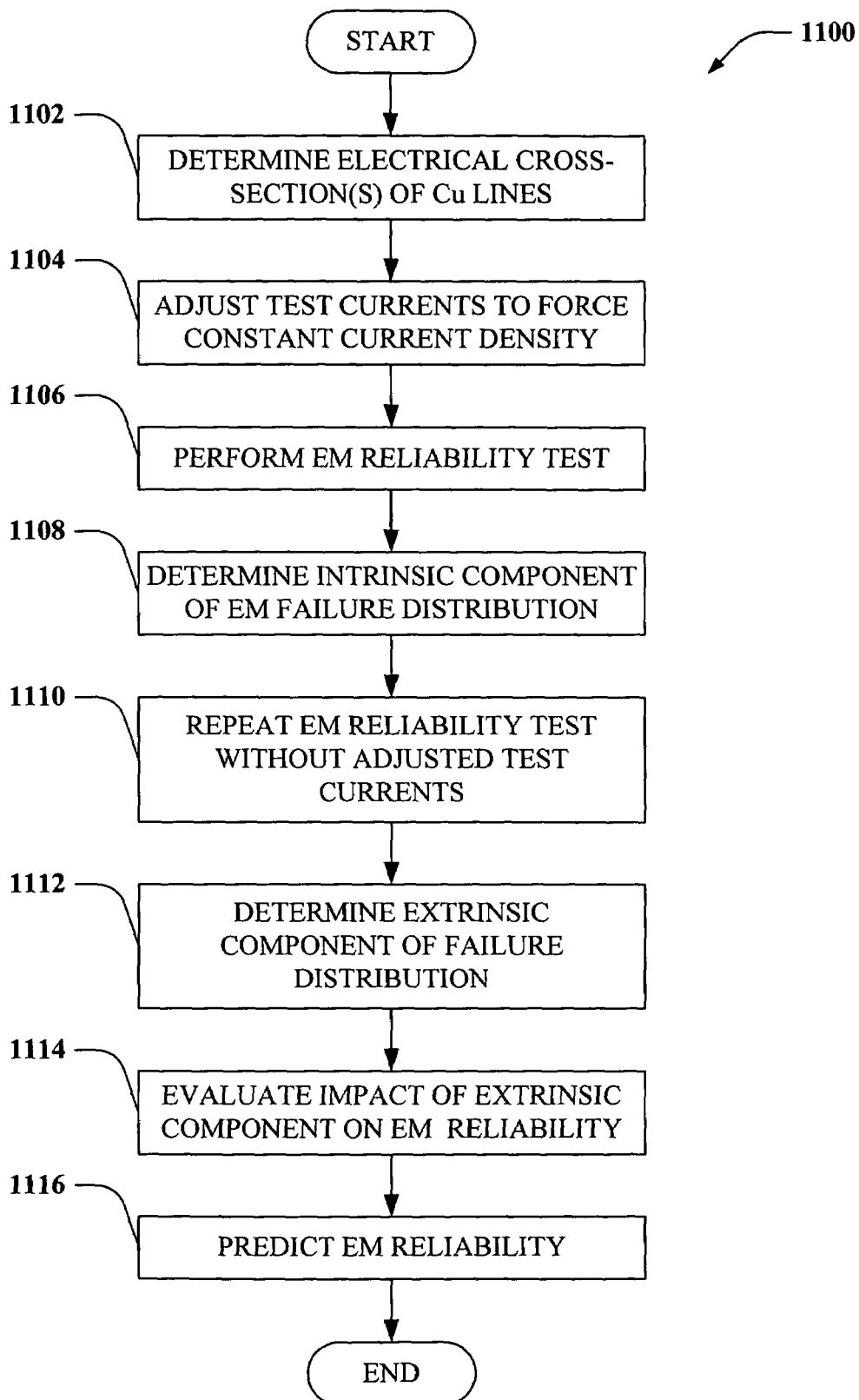
FIG. 11 is an illustration of a methodology 1100 for predicting EM reliability via decoupling intrinsic and extrinsic components thereof in accordance with an aspect of the present invention.

FIG. 11 is an illustration of a methodology 1100 for predicting EM reliability via decoupling extrinsic and intrinsic aspects of reliability. At 1102, an electrical cross-section of, for example, copper lines on a test wafer is determined. At 1104, test currents are adjusted to force a constant current density across the test wafer. Such constant current density can be, for example, 1.5 MA/cm$^2$. An EM reliability test can be performed at 1106, and a purely intrinsic component of EM reliability can be determined at 1108. Such intrinsic component can be evaluated as a component of an EM failure distribution, and an intrinsic sigma, or standard deviation, can be derived to describe the intrinsic component of EM reliability. At 1110, an EM reliability test can be performed again without a constant forced current density. This second EM reliability test can provide a comprehensive EM failure distribution from which a total standard deviation, sigma, can be derived.

At 1112 extrinsic sigma can be computed via subtracting intrinsic sigma from total sigma. The difference between the two sigmas will equal extrinsic sigma, or the standard deviation of the EM failure distribution associated with extrinsic aspects of wafer fabrication. Based on extrinsic sigma, the impact of reducing factors contributing to extrinsic sigma on total EM reliability can be evaluated at 1114. Finally, predictions can be made regarding EM reliability at 1116, base at least in part on the evaluations made at 1114.

Figure 12:
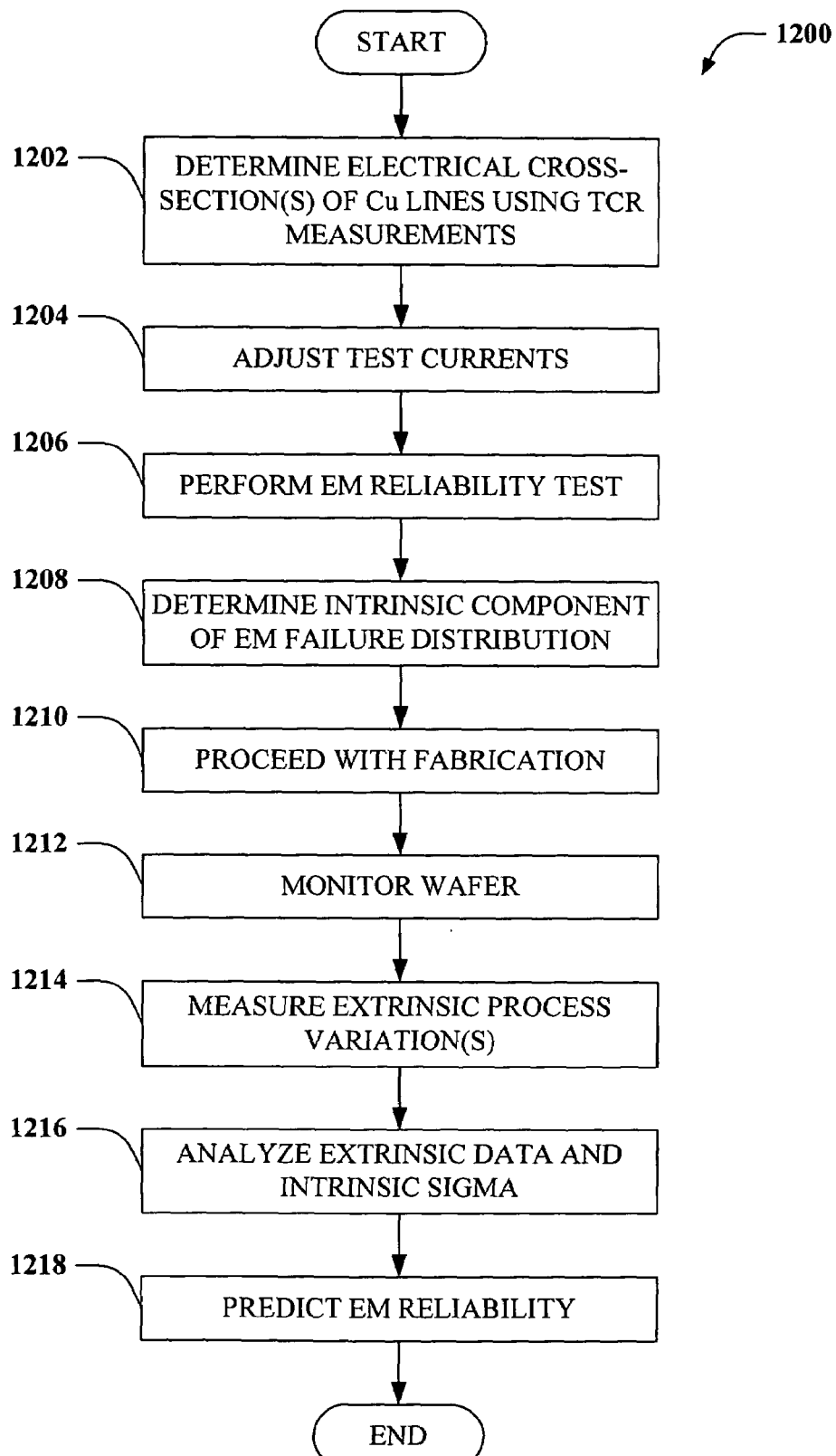
FIG. 12 is an illustration of a methodology 1200 for predicting EM reliability via decoupling intrinsic and extrinsic components thereof in accordance with an aspect of the present invention.

FIG. 12 is an illustration of a methodology 1200 for predicting EM reliability via decoupling extrinsic and intrinsic aspects of reliability. At 1202, electrical cross-sections of test lines (e.g., copper, aluminum, etc.) can be determined via, for example, TCR analysis. Then, at 1204, test currents can be set to achieve a constant current density throughout the test lines. At 1206, an EM reliability test can be performed under the constant current density condition. Because all test lines have uniform current density, a purely intrinsic component of EM reliability can be determined at 1208. For example, a failure distribution can be derived and a standard deviation there for can be determined (e.g., intrinsic sigma). Once intrinsic sigma has been determined, wafer fabrication can occur at 1210. Wafer(s) can be monitored during fabrication at 1212, and process variation(s) can be measured via wafer-level metrology system(s), such as, for example, a scatterometry system, at 1214. At 1216, process variation data can be evaluated to develop a failure distribution curve, from which a standard deviation, sigma, can be determined to facilitate evaluation of extrinsic sigma, which can be analyzed in conjunction with the previously determined intrinsic sigma. At 1218, predictions can be made regarding the effect(s) of reducing extrinsic sigma on overall EM reliability. Such predictions can be facilitated by, for example, AI techniques and/or feedback/feed-forward information, etc.

Figure 13:
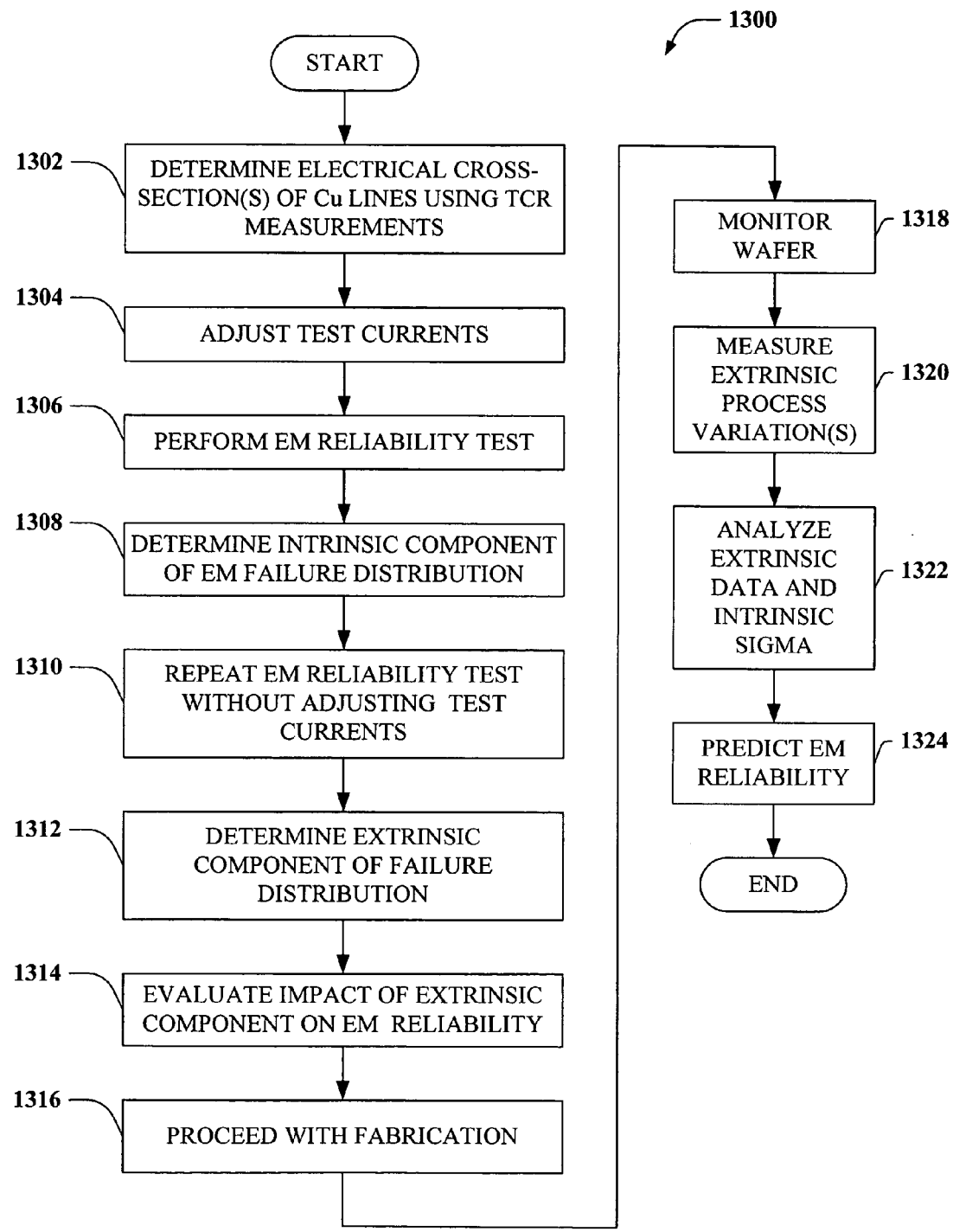
FIG. 13 is an illustration of a methodology 1300 for predicting EM reliability via decoupling intrinsic and extrinsic components thereof in accordance with an aspect of the present invention.

FIG. 13 is an illustration of a methodology 1300 for predicting EM reliability via decoupling extrinsic and intrinsic aspects of reliability. According to the methodology, at 1302, electrical cross-sections of test lines (e.g., copper, aluminum, etc.) can be determined via, for example, TCR analysis. At 1304, test currents can be adjusted to force a constant current density across all test lines. At 1306, an EM reliability test can be performed under the forced current density condition. A purely intrinsic component (e.g., intrinsic sigma) of EM reliability can be determined at 1308 from an EM failure distribution derived from the EM reliability test. At 1310, an EM reliability test can be performed again without a constant forced current density (e.g., utilizing a uniform, constant current for all test lines, etc.). This second EM reliability test can provide a comprehensive EM failure distribution from which a total standard deviation, sigma, can be derived. At 1312, extrinsic sigma can be computed via subtracting intrinsic sigma from total sigma. The difference between the two sigmas will equal extrinsic sigma, or the standard deviation of the EM failure distribution associated with extrinsic aspects of wafer fabrication. Based on extrinsic sigma, the impact of reducing factors contributing to extrinsic sigma on total EM reliability can be evaluated at 1314.

At 1316, the methodology can proceed to fabrication of wafer(s), and wafer(s) can be monitored during fabrication at 1318. At 1320, process variation(s) can be measured via wafer-level metrology system(s), such as, for example, a scatterometry system. At 1322, process variation data can be evaluated to develop a failure distribution curve, from which a standard deviation for total EM failure distribution, total sigma, can be determined to facilitate evaluation of extrinsic sigma, which can be analyzed in conjunction with the previously determined intrinsic sigma. At 1324, predictions can be made regarding potential effect(s) that reducing extrinsic sigma will have on overall EM reliability. Such predictions can be facilitated by, for example, AI techniques and/or feedback/feed-forward information, etc.

Figure 14:
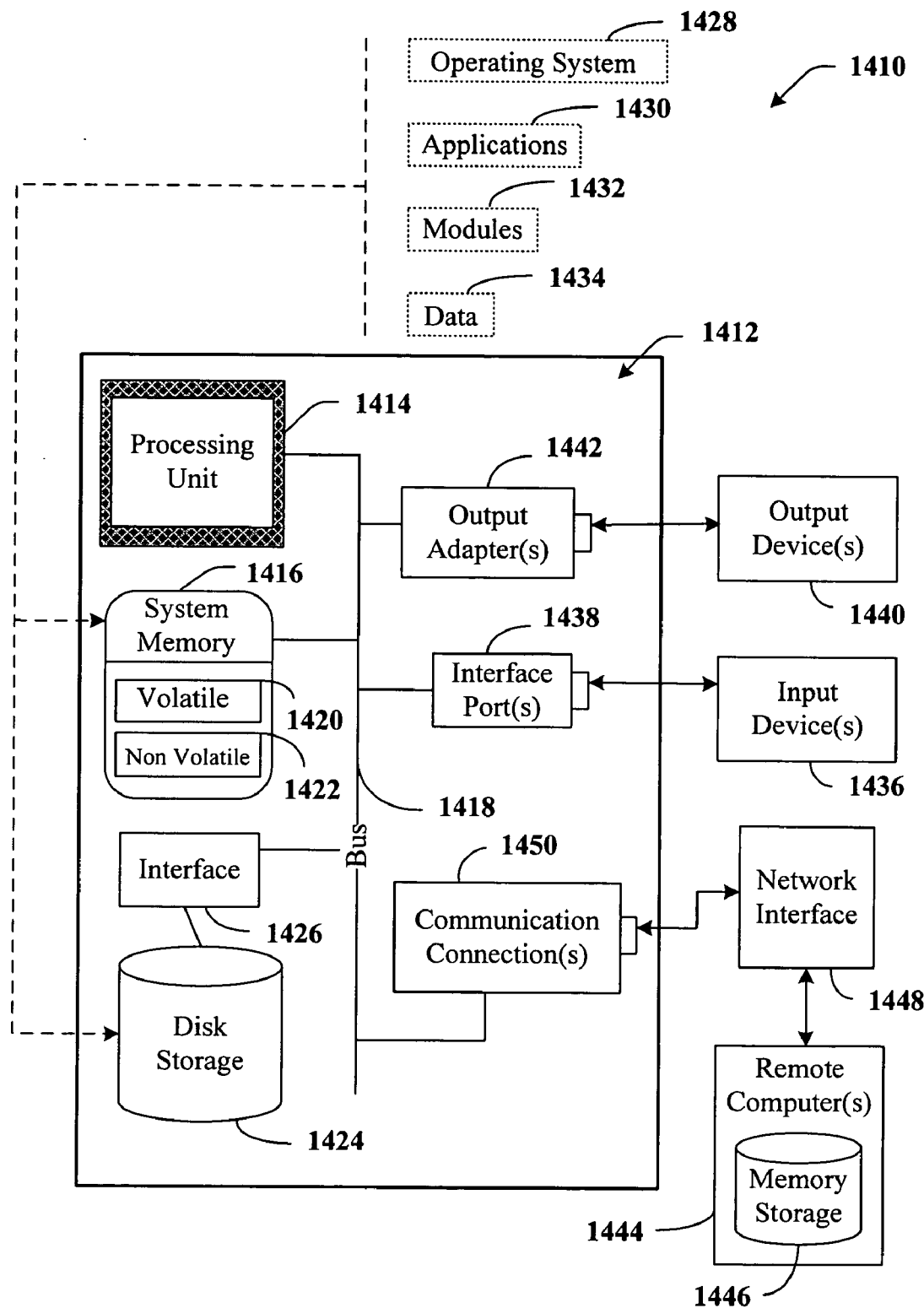
FIGS. 14 and 15 are illustrations of exemplary computing systems and/or environments in connection with facilitating employment of the subject invention.
Figure 15:
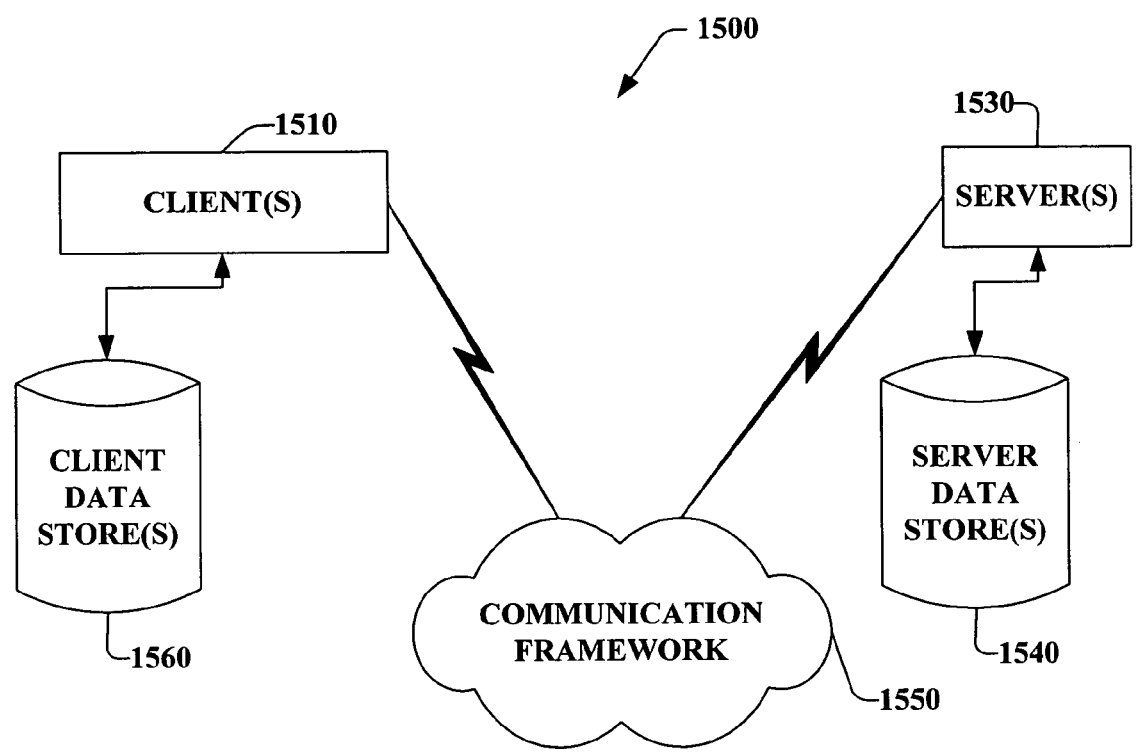

In order to provide a context for the various aspects of the invention, FIGS. 14 and 15 as well as the following discussion are intended to provide a brief, general description of a suitable computing environment in which the various aspects of the present invention can be implemented. While the invention has been described above in the general context of computer-executable instructions of a computer program that runs on a computer and/or computers, those skilled in the art will recognize that the invention also can be implemented in combination with other program modules. Generally, program modules include routines, programs, components, data structures, etc. that perform particular tasks and/or implement particular abstract data types. Moreover, those skilled in the art will appreciate that the inventive methods can be practiced with other computer system configurations, including single-processor or multiprocessor computer systems, mini-computing devices, mainframe computers, as well as personal computers, hand-held computing devices, microprocessor-based or programmable consumer electronics, and the like. The illustrated aspects of the invention can also be practiced in distributed computing environments where tasks are performed by remote processing devices that are linked through a communications network. However, some, if not all, aspects of the invention can be practiced on stand-alone computers. In a distributed computing environment, program modules can be located in both local and remote memory storage devices.

With reference to FIG. 14, an exemplary environment 1410 for implementing various aspects of the invention includes a computer 1412. The computer 1412 includes a processing unit 1414, a system memory 1416, and a system bus 1418. The system bus 1418 couples system components including, but not limited to, the system memory 1416 to the processing unit 1414. The processing unit 1414 can be any of various available processors. Dual microprocessors and other multiprocessor architectures also can be employed as the processing unit 1414.

The system bus 1418 can be any of several types of bus structure(s) including the memory bus or memory controller, a peripheral bus or external bus, and/or a local bus utilizing any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1416 includes volatile memory 1420 and nonvolatile memory 1422. The basic input/output system (BIOS), comprising the basic routines to transfer information between elements within the computer 1412, such as during start-up, is stored in nonvolatile memory 1422. By way of illustration, and not limitation, nonvolatile memory 1422 can include read only memory (ROM), programmable ROM (PROM), electrically programmable ROM (EPROM), electrically erasable ROM (EEPROM), or flash memory. Volatile memory 1420 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1412 also includes removable/non-removable, volatile/non-volatile computer storage media. FIG. 14 illustrates, for example, a disk storage 1424. Disk storage 1424 includes, but is not limited to, devices like a magnetic disk drive, floppy disk drive, tape drive, Jaz drive, Zip drive, LS-100 drive, flash memory card, or memory stick. In addition, disk storage 1424 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1424 to the system bus 1418, a removable or non-removable interface is typically used such as interface 1426.

It is to be appreciated that FIG. 14 describes software that acts as an intermediary between users and the basic computer resources described in suitable operating environment 1410. Such software includes an operating system 1428. Operating system 1428, which can be stored on disk storage 1424, acts to control and allocate resources of the computer system 1412. System applications 1430 take advantage of the management of resources by operating system 1428 through program modules 1432 and program data 1434 stored either in system memory 1416 or on disk storage 1424. It is to be appreciated that the present invention can be implemented with various operating systems or combinations of operating systems.

A user enters commands or information into the computer 1412 through input device(s) 1436. Input devices 1436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1414 through the system bus 1418 via interface port(s) 1438. Interface port(s) 1438 include, for example, a serial port, a parallel port, a game port, and a universal serial bus (USB). Output device(s) 1440 use some of the same type of ports as input device(s) 1436. Thus, for example, a USB port can be used to provide input to computer 1412, and to output information from computer 1412 to an output device 1440. Output adapter 1442 is provided to illustrate that there are some output devices 1440 like monitors, speakers, and printers, among other output devices 1440, which require special adapters. The output adapters 1442 include, by way of illustration and not limitation, video and sound cards that provide a means of connection between the output device 1440 and the system bus 1418. It should be noted that other devices and/or systems of devices provide both input and output capabilities such as remote computer(s) 1444.

Computer 1412 can operate in a networked environment utilizing logical connections to one or more remote computers, such as remote computer(s) 1444. The remote computer(s) 1444 can be a personal computer, a server, a router, a network PC, a workstation, a microprocessor based appliance, a peer device or other common network node and the like, and typically includes many or all of the elements described relative to computer 1412. For purposes of brevity, only a memory storage device 1446 is illustrated with remote computer(s) 1444. Remote computer(s) 1444 is logically connected to computer 1412 through a network interface 1448 and then physically connected via communication connection 1450. Network interface 1448 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1450 refers to the hardware/software employed to connect the network interface 1448 to the bus 1418. While communication connection 1450 is shown for illustrative clarity inside computer 1412, it can also be external to computer 1412. The hardware/software necessary for connection to the network interface 1448 includes, for exemplary purposes only, internal and external technologies such as, modems including regular telephone grade modems, cable modems and DSL modems, ISDN adapters, and Ethernet cards.

FIG. 15 is a schematic block diagram of a sample-computing environment 1500 with which the present invention can interact. The system 1500 includes one or more client(s) 1510. The client(s) 1510 can be hardware and/or software (e.g., threads, processes, computing devices). The system 1500 also includes one or more server(s) 1530. The server(s) 1530 can also be hardware and/or software (e.g., threads, processes, computing devices). The servers 1530 can house threads to perform transformations by employing the present invention, for example. One possible communication between a client 1510 and a server 1530 can be in the form of a data packet adapted to be transmitted between two or more computer processes. The system 1500 includes a communication framework 1550 that can be employed to facilitate communications between the client(s) 1510 and the server(s) 1530. The client(s) 1510 are operably connected to one or more client data store(s) 1560 that can be employed to store information local to the client(s) 1510. Similarly, the server(s) 1530 are operably connected to one or more server data store(s) 1540 that can be employed to store information local to the servers 1530.

What has been described above comprises examples of the present invention. It is, of course, not possible to describe every conceivable combination of components or methodologies for purposes of describing the present invention, but one of ordinary skill in the art can recognize that many further combinations and permutations of the present invention are possible. Accordingly, the present invention is intended to embrace all such alterations, modifications and variations that fall within the spirit and scope of the appended claims. Furthermore, to the extent that the term "comprises" is used in either the detailed description or the claims, such term is intended to be inclusive in a manner similar to the term "comprising" as "comprising" is interpreted when employed as a transitional word in a claim.

What is claimed is:

1. A system that facilitates predicting electromigration (EM) reliability in semiconductor interconnect lines, comprising:
    a temperature coefficient of resistance (TCR) component that determines an electrical cross-section of at least one test line on a wafer;
    an EM component that performs at least one EM reliability test on test lines on the wafer; and
    a control component that analyzes information received from each of the TCR component and the EM component to derive an EM failure distribution and to decouple an intrinsic and extrinsic components of EM reliability.

2. The system of claim 1, further comprising a monitoring component that gleans information regarding at least one physical parameter of a wafer.

3. The system of claim 2, the monitoring component is a scatterometry system.

4. The system of claim 1, the control component adjusts at least one test current in at least one test line to force a constant current density across the wafer during the at least one EM reliability test.

5. The system of claim 4, the control component adjusts the at least one test current according to the electrical cross-section of the at least one test line to achieve a desired constant current density.

6. The system of claim 1, the control component determines a standard deviation, sigma, for each of the intrinsic and extrinsic components.

7. The system of claim 1, further comprising an artificial intelligence component that makes inferences regarding predicting EM reliability when extrinsic sigma is mitigated.

8. A method for predicting EM reliability in wafer interconnect lines by decoupling intrinsic sigma and extrinsic sigma, comprising:
    determining electrical cross-sections of test lines;
    adjusting test currents for individual test lines to create a constant current density across all test lines;
    performing a first EM reliability test at constant current density to determine an intrinsic component of EM reliability; and
    performing a second EM reliability test with single constant current applied through all test lines to determine total EM reliability.

9. The method of claim 8, further comprising deriving a failure distribution for the first EM reliability test.

10. The method of claim 9, further comprising determining intrinsic sigma for the intrinsic component of EM reliability based at least in part on the derived failure distribution of the first EM reliability test.

11. The method of claim 10, further comprising deriving a failure distribution for the second EM reliability test.

12. The method of claim 11, further comprising determining a total sigma for total EM reliability based at least in part on the derived failure distribution of the second EM reliability test.

13. The method of claim 12, further comprising determining extrinsic sigma by subtracting intrinsic sigma from total sigma.

14. The method of claim 13, further comprising employing information derived from extrinsic sigma to control process variation in a wafer fabrication environment.

15. The method of claim 13, further comprising predicting total EM reliability when extrinsic sigma is decreased.

16. The method of claim 10, further comprising monitoring a wafer during fabrication to measure process variation.

17. The method of claim 16, further comprising determining extrinsic sigma from monitored process variation information.

18. The method of claim 17, further comprising further comprising combining extrinsic sigma with intrinsic sigma to predict total EM reliability of production wafers.

19. A system that facilitates decoupling intrinsic and extrinsic components of EM reliability in production wafers, comprising:
   means for adjusting currents through test lines on a test wafer;
   means for testing EM reliability;
   means for determining a standard deviation for an intrinsic component of an EM reliability failure distribution;
   means for determining a standard deviation for a total EM reliability failure distribution; and
   means for evaluating the difference between the standard deviation for the total EM reliability failure distribution and the standard deviation of the intrinsic component of the EM reliability failure distribution, in order to determine the standard deviation of an extrinsic component of the EM reliability failure distribution.

20. The system of claim 19, further comprising means for predicting EM reliability when the extrinsic component is diminished.

21. The system of claim 19, further comprising means for monitoring a production wafer to detect process variations that affect EM reliability.

22. The system of claim 21, further comprising means for mitigating process variations that affect EM reliability.

23. The system of claim 22, further comprising means for predicting EM reliability based on information associated with the intrinsic component of EM reliability when process variations are mitigated.

* * * * *

UNITED STATES PATENT AND TRADEMARK OFFICE
CERTIFICATE OF CORRECTION

PATENT NO. : 7,146,588 B1  Page 1 of 1
APPLICATION NO. : 10/909438
DATED : December 5, 2006
INVENTOR(S) : Amit P. Marathe et al.

It is certified that error appears in the above-identified patent and that said Letters Patent is hereby corrected as shown below:

Column 4, Line 36:
Please change "diffision" to -- diffusion --

Signed and Sealed this

Thirtieth Day of January, 2007

JON W. DUDAS
*Director of the United States Patent and Trademark Office*